US010910772B2

(12) United States Patent
Ritchie

(10) Patent No.: US 10,910,772 B2
(45) Date of Patent: Feb. 2, 2021

(54) ELECTRICAL SAFETY SYSTEM FOR WET AREAS

(71) Applicant: CONDUCTOR HUB PTY LTD, Oxenford (AU)

(72) Inventor: Austen Ritchie, Wongawallan (AU)

(73) Assignee: CONDUCTOR HUB PTY LTD, Brisbane Queenslan (AU)

(*) Notice: Subject to any disclaimer, the term of this patent is extended or adjusted under 35 U.S.C. 154(b) by 0 days.

(21) Appl. No.: 16/610,250

(22) PCT Filed: May 2, 2018

(86) PCT No.: PCT/AU2018/050401
§ 371 (c)(1),
(2) Date: Nov. 1, 2019

(87) PCT Pub. No.: WO2018/201189
PCT Pub. Date: Nov. 8, 2018

(65) Prior Publication Data
US 2020/0059043 A1 Feb. 20, 2020

(30) Foreign Application Priority Data

May 2, 2017 (AU) .................. 2017901585

(51) Int. Cl.
H01R 13/648 (2006.01)
E04H 4/06 (2006.01)
H02G 3/08 (2006.01)
H02G 3/12 (2006.01)
H02G 3/14 (2006.01)
H05K 9/00 (2006.01)

(52) U.S. Cl.
CPC ............. H01R 13/648 (2013.01); E04H 4/06 (2013.01); H02G 3/088 (2013.01); H02G 3/12 (2013.01); H02G 3/14 (2013.01); H05K 9/0003 (2013.01)

(58) Field of Classification Search
CPC ........ H01R 13/648; H02G 3/088; H02G 3/12; H02G 3/14; H05K 9/0003; E04H 4/06
USPC .................................... 439/92, 95, 101
See application file for complete search history.

(56) References Cited

U.S. PATENT DOCUMENTS 1,426,210 A * 8/1922 O'Neil ..................... H02G 3/16
174/59
1,949,883 A 3/1934 Sharp
4,885,428 A * 12/1989 Roberts ................... H01R 4/66
174/6

(Continued)

OTHER PUBLICATIONS

Switzer, W.K., "Practical Guide to Electrical Grounding", An ERICO Publication, ERICO Electrical Protection Products, 1999, https://www.erico.com/catalog/literature/G157LT99.pdf pp. 4, 5, 12, 75, 107; figures 1.1-1.7, 1.31-1.34, 4.3, 6.42.

(Continued)

Primary Examiner — Hien D Vu
(74) Attorney, Agent, or Firm — Lathrop GPM, LLP

(57) ABSTRACT

An electrical safety system, for use in a wet area, the electrical safety system comprising a resealable housing, for installation into the wet area, a conductive bar extending through a side of the housing, for installation against a conductive element adjacent to the housing and an electrical coupling, coupled to the bar and housed in the housing, for coupling to an earth wire to earth the bar and thus the conductive element.

19 Claims, 5 Drawing Sheets

(56) References Cited

U.S. PATENT DOCUMENTS

| | | | |
|---|---|---|---|
| 4,959,506 A | 9/1990 | Petty et al. | |
| 5,607,224 A | 3/1997 | Tobias et al. | |
| 5,877,703 A * | 3/1999 | Bloss, Jr. ............... | G01D 4/004 340/870.02 |
| 6,733,345 B2 | 5/2004 | Weise et al. | |
| 2016/0028183 A1 | 1/2016 | Koller et al. | |

OTHER PUBLICATIONS

Fulton Industries Australia, "Prodict Catalogue", 2011-2014 Version 1.7, https://web.archive.org/web/2013084080028/http://www.fultonindustries.com/au/pdf/Product_Catalogue_Complete.pdf Published Aug. 14, 2013 as per Wayback Machine. pages 2-29, 8-19-, 8-27; part 8.

The Grounding Superstore, "Grounding Solutions", Burndy LLC., 2016, https://web.archive.org/web/201503172220604/http://ecat.burndy.com/Comergent/burndy/documentation/BURNDY_Grounding_Catalog.pdf, Published Mar. 17, 2015 as per Wayback Machine pp. 10, 11, 42 50.

Contract Connections, "WRICON", Transnet NZ Limited, 2015, https://web.archive.org/web/20160210073500/http://www.transnet.co.nz/site/transnet/files/datasheets/Trasnet%Contract%Connections.pdf, Published Feb. 10, 2016 as per Wayback machine.

Electrical Knowhow, "Earthing System Components—Part Two", 2013, pp. 1-7, http://www.electrical-knowhow.com/2013/06/earthing-system-components-part-two.html> pp. 1-7.

PCT Application No. PCT/AU2018/050401, International Search Report and Written Opinion, dated Jul. 24, 2018, 11 pages.

\* cited by examiner

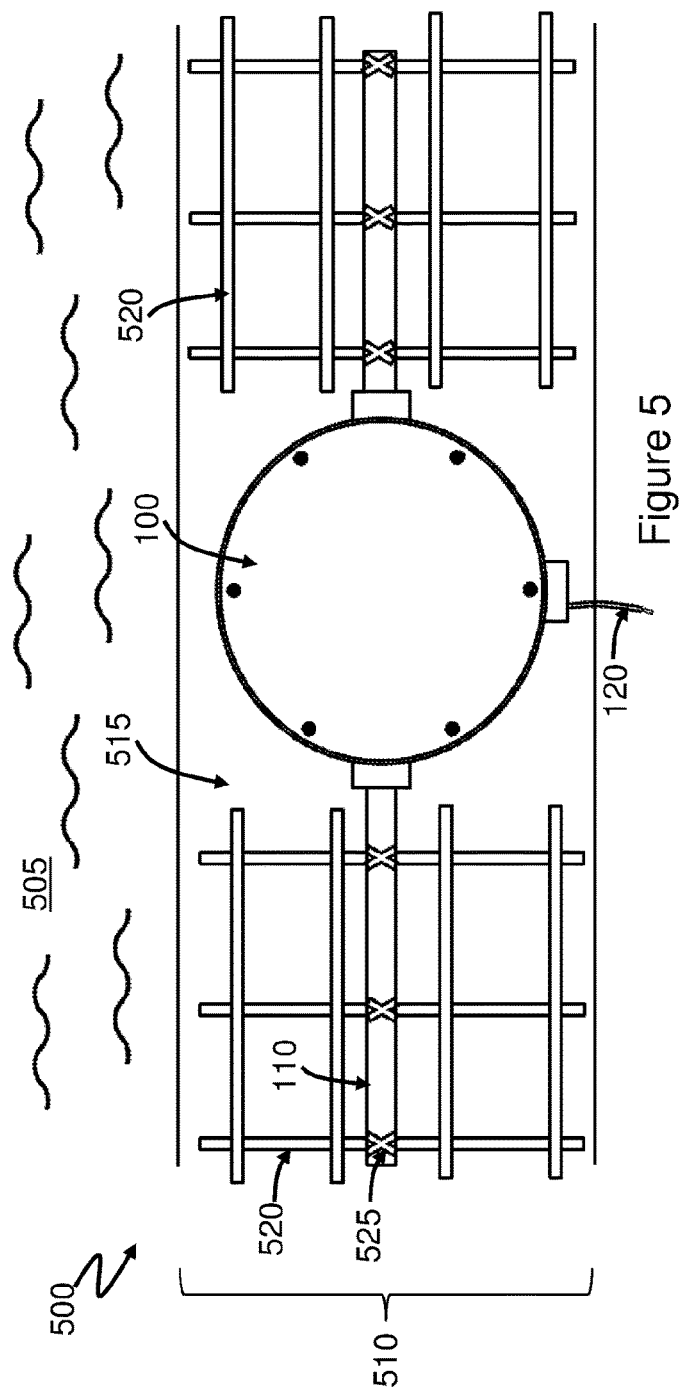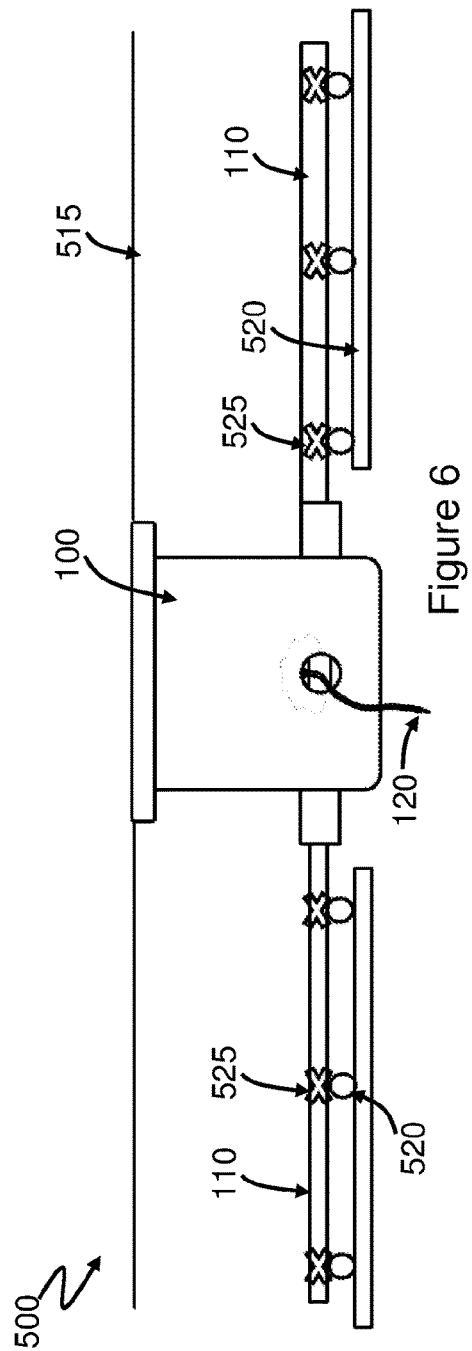

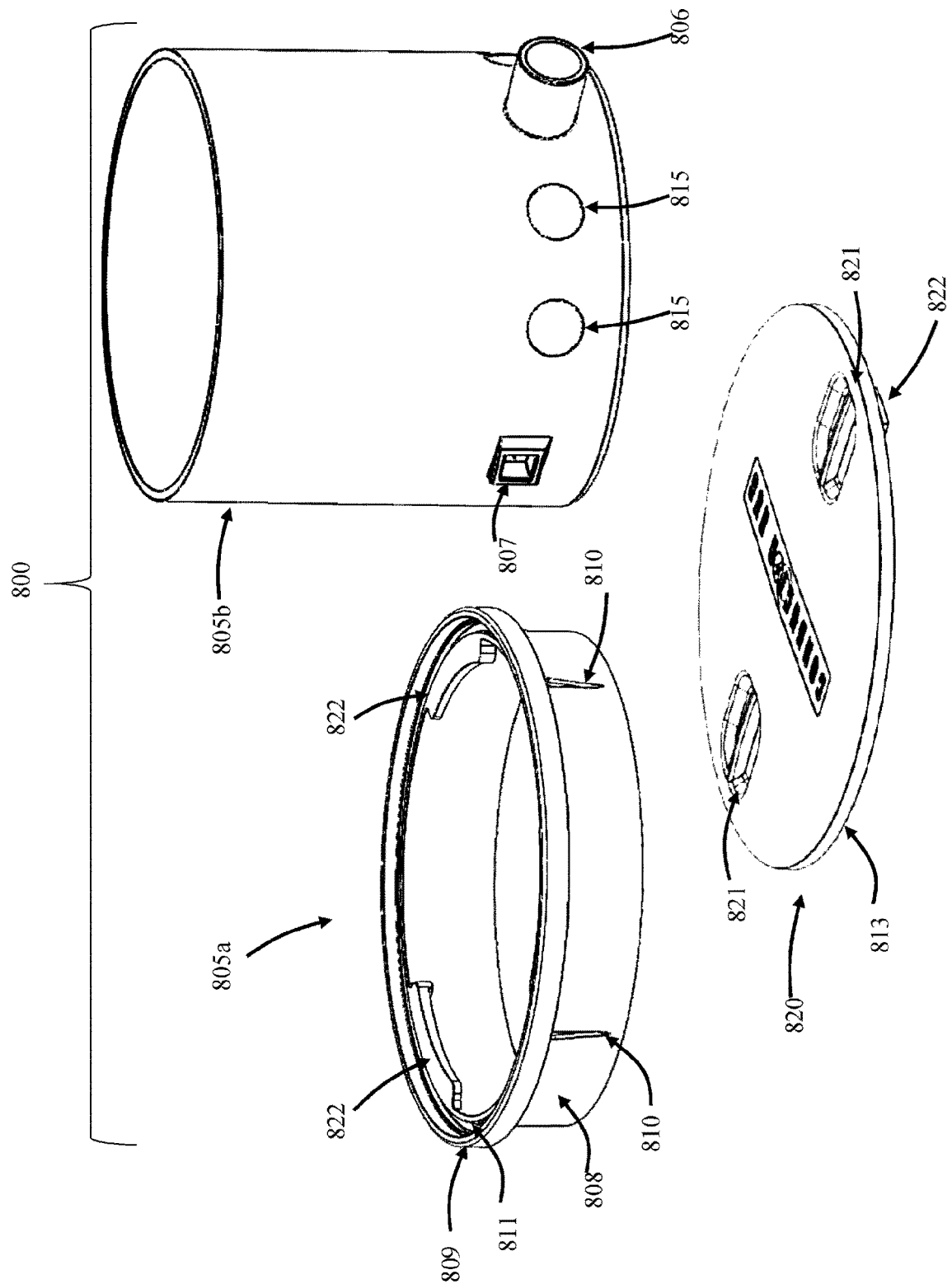

ELECTRICAL SAFETY SYSTEM FOR WET AREAS

TECHNICAL FIELD

The present invention relates to electrical safety, and in particular, although not exclusively, to earthing of metal objects, such as concrete reinforcing bar, in wet areas, such as swimming pools, spas and bathrooms.

BACKGROUND ART

In wet environments, such as swimming pools, bathrooms and the like, conductive objects (e.g. metal) are typically earthed (grounded) to a common earth. In case of an electrical fault, where one of the conductive objects becomes "live", it is immediately directed to the earth, upon which a circuit breaker may detect the fault and interrupt the circuit.

Furthermore, as the conductive objects are connected to a common earth, and thus to each other, the objects have substantially the same electrical potential, and as such, electric current is unlikely to flow between objects (e.g. by a person), even in case of a fault.

In concrete swimming pools and bathrooms, it is important that even the reinforcing bars of the concrete are connected to the earth, to ensure that no dangerous potential gradients are produced during a fault.

A problem with such wet environments of the prior art is that it is difficult to later test that all conductive items are connected to a common earth. As an illustrative example, once a concrete swimming pool or bathroom is poured, the reinforcing bars of the concrete are no longer accessible to test.

Australian/New Zealand Standard 3000:2007 Amendment 2 requires that an equipotential bonding conductor be connected between, among other things, the conductive pool structure, and the earthing conductors associated with each circuit supplying the pool.

However, conformance with the Standard can typically only be verified by exposing the reinforcing bars, and thus by removing part of the concrete of the pool. Such process is obviously costly, time consuming and inconvenient, as it damages the pool structure.

Similar requirements apply to other wet areas, such as bathrooms and the like, and in other jurisdictions.

As such, there is clearly a need for an improved electrical safety system.

It will be clearly understood that, if a prior art publication is referred to herein, this reference does not constitute an admission that the publication forms part of the common general knowledge in the art in Australia or in any other country.

SUMMARY OF INVENTION

The present invention is directed to an electrical safety system for use in wet areas, which may at least partially overcome at least one of the abovementioned disadvantages or provide the consumer with a useful or commercial choice.

With the foregoing in view, the present invention in one form, resides broadly in an electrical safety system, for use in a wet area, the electrical safety system comprising:

a resealable housing, for installation into the wet area;

a conductive bar extending through a side of the housing, for installation against a conductive element adjacent to the housing; and an electrical coupling, coupled to the bar and housed in the housing, for coupling to an earth wire to earth the bar and thus the conductive element.

Advantageously, the electrical safety system allows for earthing of conductive elements, such as reinforcement bars, to be easily inspected. As such, faults in earthing are much more easily identifiable, which makes it quicker to identify and correct faults, which in turn increases safety. Furthermore, as faults in earthing are easily inspected, inspection costs are reduced, and invasive inspection techniques are not necessary.

Preferably, the conductive element is concealed. The conductive element may comprise reinforcement bars cast into concrete. The housing may also be cast into the concrete. The housing may be cast into the concrete so that an upper surface thereof is flush with a surface of the concrete.

Preferably, the housing includes vertical sidewalls, through which the conductive bar extends. Suitably, the housing includes a substantially planar base, from which the sidewalls upwardly extend.

Preferably, the housing includes a removable lid. The removable lid may be configured to provide substantially unobstructed access to an interior of the housing.

Preferably, a seal is provided between the housing and the lid. The seal may comprise an O-ring.

Preferably, the housing includes apertures, in the sidewalls, through which the conductive bar extends. Preferably, the apertures comprise elongate channels extending outwardly from the housing.

Preferably, the housing includes an aperture, through which the earth wire extends.

Preferably, the housing includes a plurality of apertures, through which a plurality of earth wires may extend.

Preferably, the housing is substantially cylindrical in shape.

Preferably, the base and sidewalls are formed of a single piece of plastic.

Preferably, the electrical coupling includes a plurality of coupling elements, for coupling a plurality of additional conductive elements to the bar, and thus to earth the components to a common earth. The coupling elements may comprise apertures for receiving electrical wires.

The additional conductive elements may include metal fixtures, windows, electrical components and the like.

Preferably, the bar comprises one or more metallic rods. Suitably, the bar comprises copper rod or stainless steel or brass or galvanised steel. The rod may be circular in cross section. The rod may be rectangular in cross section. The bar may comprise a flat bar.

Preferably, the bar is at least 30 cm long. Suitably, the bar is at least 50 cm long. The bar may be at least 80 cm long and is more preferably approximately 100 cm in length.

Preferably, the bar is coupled to the conductive element at two or more points. The bar may be clamped to the conductive element.

Preferably, the conductive bar extends through opposing sides of the housing, for installation against the conductive element on both sides of the housing.

Preferably, the wet area is a concrete pool, and the conductive element is steel reinforcement bar in the concrete of the pool. The housing may be located in a coping of the pool.

Alternatively, the wet area may comprise a bathroom and/or a surrounding concreted area.

In another form, the invention resides broadly in an electrical safety system the electrical safety system comprising:

a resealable housing, for casting into a concrete floor or wall; a conductive bar extending through a side of the housing, for installation against a conductive element adjacent to the housing and cast into the concrete floor or wall; and an electrical coupling, coupled to the bar and housed in the housing, for coupling to an earth wire to earth the bar and thus the conductive element.

The bar is preferably rectangular and in a particularly preferred embodiment, square. A rectangular bar gives a flat surface for the bus bar to be connected. The rectangular bar also gives a larger surface area for connection to reinforcing steel. The square bar also hold the base of the housing in place so the housing does not rotate before concrete placement.

The copper bar is preferably approximately 1000 mm long. This enables the housing to fit within multiple types of environments and reinforcing patterns. For example, standard reinforcing mesh is provided in a 200 mm pattern, and pool reinforcing can be provided up to 300 mm in pattern. Using a bar of the preferred length means that there will still be 3 or 4 connection points even on the larger pool reinforcing mesh pattern. By utilizing four connection points, an even connection to the reinforcing steel is achieved to spread the connection. Under the Australian standard, conventional tie wire is accepted as a connection means for the rest of the structure.

The base of the housing preferably includes a number of indents in the mould to identify drill points or knock out portions to allow the addition of extra connection points. This enables the installer to line the connection point up to the conductor bar.

The base of the housing preferably has at least a pair of opposed rectangular holes to accept the conductor bar through the housing. This will also preferably prevent the base of the housing from rotating once installed, before concrete is placed.

The base of the housing is preferably approximately 150 mm high and can be cut down to suit concrete thickness and tile thickness, without affecting concrete strength (cover thickness).

The upper portion of the housing is preferably provided as an annular collar. The collar preferably fits internally into the base and slides relative thereto. Preferably the collar has crush folds or crush zones in a number of locations that squash/deform to fit at any height within the base.

The collar is preferably made from Acrylonitrile styrene acrylate (ASA) to prevent damage from prolonged exposure from the elements.

The lid is preferably provided and designed to attach to or relative to the collar, preferably with a bayonet fitting. The lid preferably has a number of indents to allow locking and unlocking of the lid relative to the collar. The design of the indents also allows for use of a tool such as electrician's pliers to fit over and tap to unlock if the lid is too tight for finger operation.

The configuration of the indents and/or the degree of freedom of the bayonet fitting can also be used to lock the lid to minimise the chance that a user can open the housing without a tool.

The collar may be installed out of level and/or or at an angle relative to the lower portion of the housing to account for any difference in level and/or angle of reinforcing steel to the finished level of the concrete.

Any of the features described herein can be combined in any combination with any one or more of the other features described herein within the scope of the invention.

The reference to any prior art in this specification is not, and should not be taken as an acknowledgement or any form of suggestion that the prior art forms part of the common general knowledge.

BRIEF DESCRIPTION OF DRAWINGS

Various embodiments of the invention will be described with reference to the following drawings, in which:

FIG. 5 illustrates a top view of a portion of a swimming pool including the safety system of FIG. 1, according to an embodiment of the present invention;

FIG. 6 illustrates a side view of the portion of the swimming pool of FIG. 5;

FIG. 8 illustrates an electrical safety system with an upper portion, a lower portion and a lid.

Preferred features, embodiments and variations of the invention may be discerned from the following Detailed Description which provides sufficient information for those skilled in the art to perform the invention. The Detailed Description is not to be regarded as limiting the scope of the preceding Summary of the Invention in any way.

DESCRIPTION OF EMBODIMENTS

Figure 1:
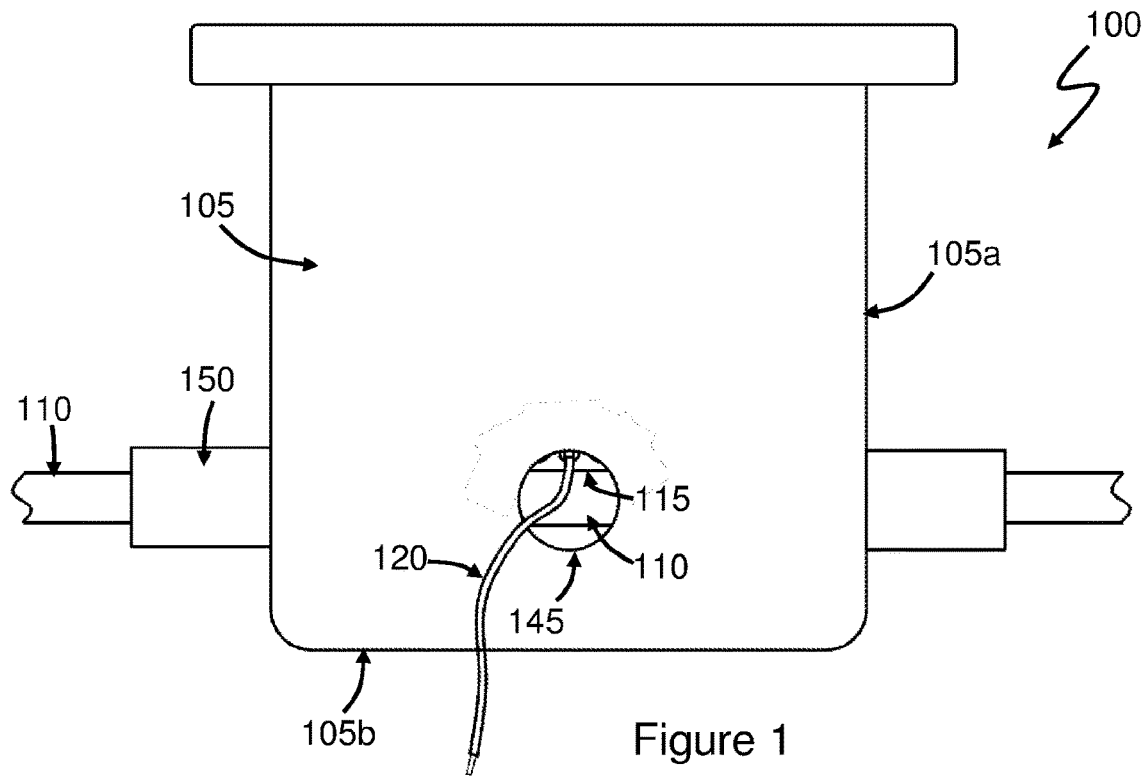
FIG. 1 illustrates a side view of an electrical safety system, according to an embodiment of the present invention.

FIG. 1 illustrates a side view of an electrical safety system 100, according to an embodiment of the present invention. The electrical safety system 100 enables easy inspection of earthing associated with underground reinforcement in wet areas, such as pools, bathrooms and the like. As such, inspection costs are reduced, and faults in earthing are much more easily identifiable, which makes it quicker to identify and correct faults, which in turn increases safety.

Figure 2:
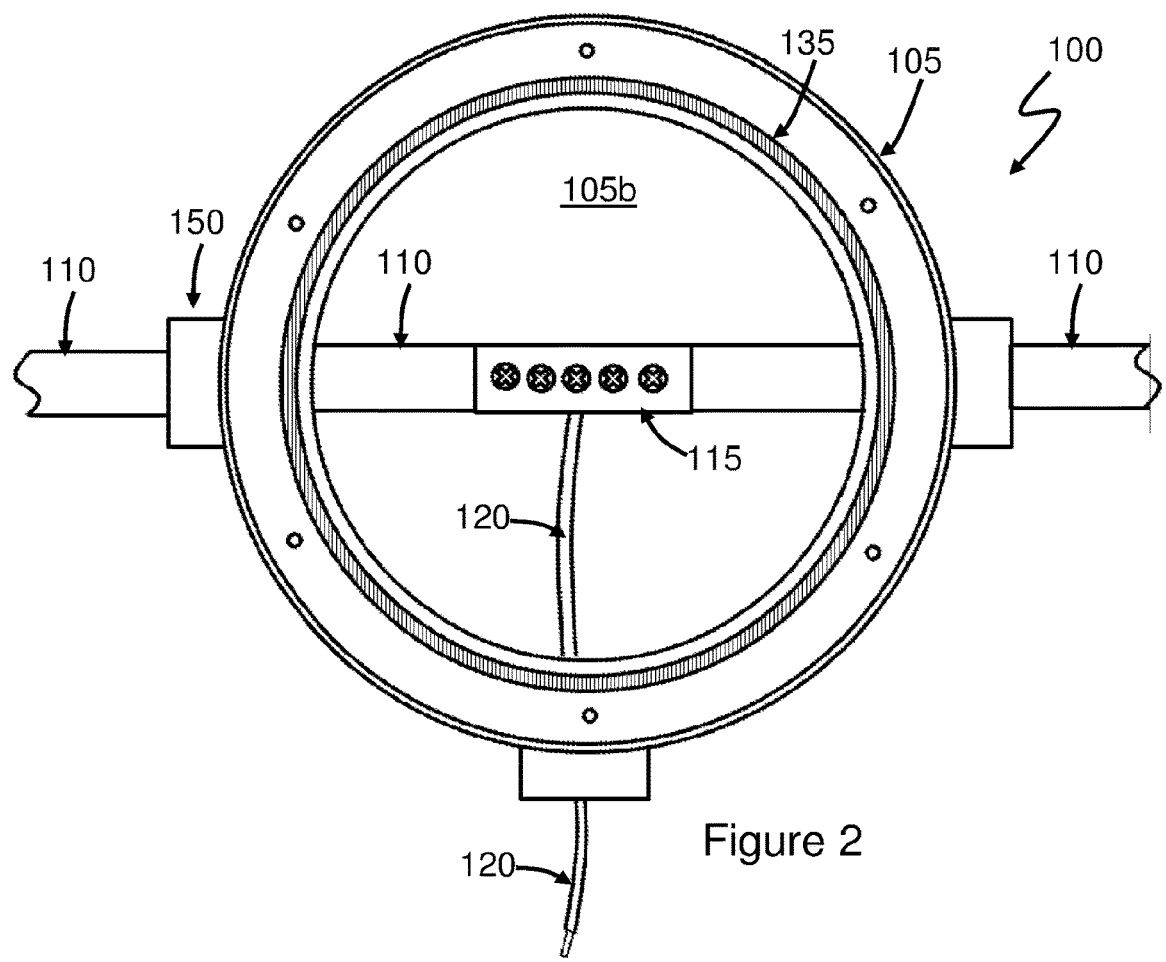
FIG. 2 illustrates a top view of the electrical safety system of FIG. 1, with a lid removed.
Figure 3:
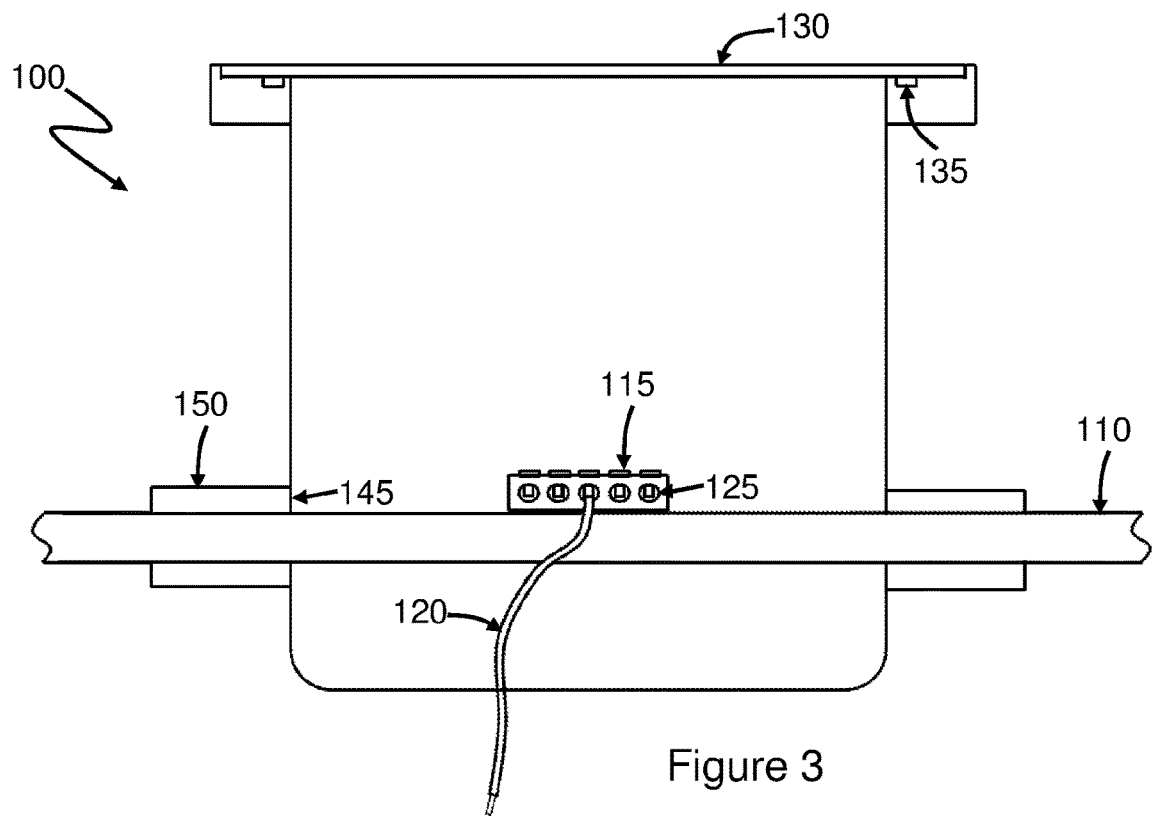
FIG. 3 illustrates a side cut-away view of the electrical safety system of FIG. 1.
Figure 4:
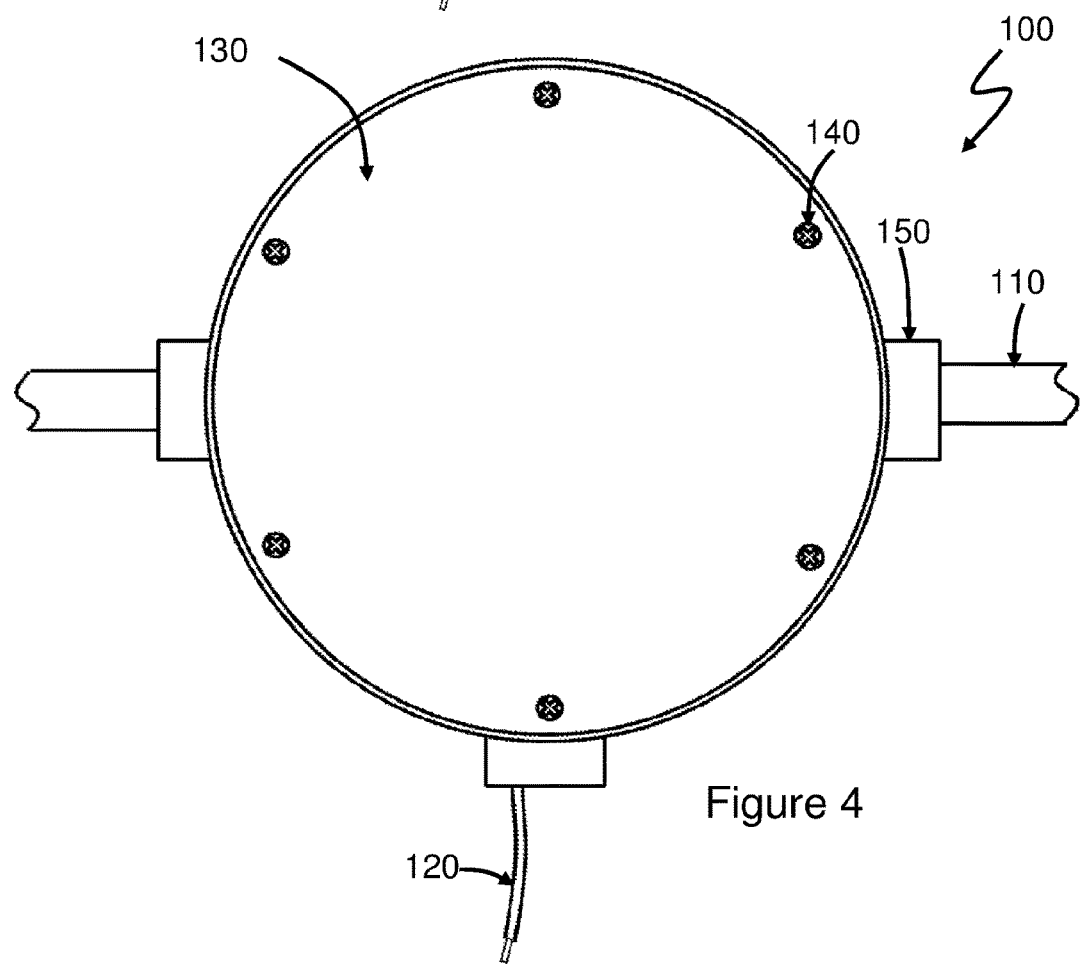
FIG. 4 illustrates a top view of the electrical safety system of FIG. 1, with a lid installed.

FIG. 2 illustrates a top view of the electrical safety system 100, with a lid removed to illustrate an internal configuration of the electrical safety system 100 from above. FIG. 3 illustrates a side cut-away view of the electrical safety system 100 to illustrate an internal configuration of the electrical safety system 100 from the side, and FIG. 4 illustrates a top view of the electrical safety system 100, with a lid installed.

The electrical safety system 100 includes a resealable housing 105, for installation into the wet area, and a conductive bar 110 that extends through opposing sides 105a of the housing 105, for installation against reinforcement bar or mesh (commonly known as rebar) that is adjacent to the housing 105.

As best illustrated in FIGS. 2 and 3, an electrical coupling in the form of a terminal block 115 is electrically coupled to the bar 110 and housed in the housing 105, and coupled to an earth wire 120 to earth the bar 110 and thus earth the reinforcement bar.

The earth wire 120 is illustrated as a short wire for clarity, but the skilled addressee will readily appreciate that the earth wire 120 is typically several meters long, and may be of any suitable length to be coupled to the earth point.

The terminal block 115 is conductive, and may be formed of copper, brass or other suitable conductive material. In such case, the terminal block may be attached to the bar 110 in any way including welding, brazing, screwing, or bolting to the bar 110. Any screws or bolts used would preferably be stainless steel or brass for example. Alternatively, the terminal block may have conductive components that electrically couple wires therein to the bar 110.

As best illustrated in FIG. 3, the terminal block 115 has a plurality of coupling elements in the form of apertures 125 for receiving wires coupled to additional conductive elements in proximity to the system 100. Examples of additional conductive elements in relation to a pool area may include metallic pool fencing, metallic window frames, metal fixtures, a pool pump, and a hand rail.

By coupling the additional conductive elements to the terminal block 115, the additional conductive elements are also coupled to the same earth. As the conductive elements are connected to a common earth, the conductive elements have substantially the same electrical potential, and as such, electric current is unlikely to flow between objects (e.g. by a person), even in case of a fault. Furthermore, in case of an electrical fault, where one of the conductive objects becomes "live", it is immediately directed to the earth, upon which a circuit breaker may detect the fault and interrupt the circuit.

As best illustrated in FIGS. 1 and 3, the housing 105 includes a planar base 105b, from which the sidewalls 105a upwardly extend. The sidewalls 105a are substantially vertical, and are at an angle of about 90 degrees to the base 105b. The housing 105 is substantially cylindrical in shape.

As best illustrated in FIGS. 3 and 4, the housing 105 includes a removable lid 130. The removable lid 130 provides substantially unobstructed access to an interior of the housing 105 when it is removed. As such, when the housing 105 is cast into concrete, it enables inspection of electrical couplings (earth points) that otherwise would be obscured by the concrete.

A seal, in the form of an O-ring 135, is provided between the housing 105 and the lid 130 to prevent water (or dust) from entering the housing 105 at the lid 130. A plurality of screws 140 are used to hold the lid 130 in place, and against the O-ring 135. As the screws 140 are placed around the lid 130, the lid 130 is less likely to warp and deform, thus increasing reliability of the seal.

The housing 105 includes apertures 145, each associated with an outwardly extending and encircling sidewall 150 forming a continuous rim around the aperture 145. Two of the apertures are on opposing sidewalls 105a, and have aligning rims to enable the elongate bar 110 to extend directly therethrough.

A third aperture 145 (and associated rim) is provided at a same height on the sidewalls 105a as the two apertures, but facing another direction, to enable the earth wire 120 to extend therethrough and access the terminal block 115.

While only three apertures 145 are illustrated, the skilled addressee will readily appreciate that any number of apertures 145 may be provided, and any further apertures may be provided at any suitable height and in any suitable direction.

Preferably, the base 105b and sidewalls 105a are formed of a single piece of plastic.

The bar 110 comprises a metallic rod in the form of a copper rod. The bar 110 is preferably at least 30 cm long, and more preferably at least 50 cm long. The bar may be at least 80 cm long.

The bar 110 is cast into the concrete and clamped with reinforcement bar, as outlined below. As such, having a long bar enables the bar 110 to be clamped to reinforcement at various places, which provides redundancy should one of the clamps fail.

FIG. 5 illustrates a top view of a portion of a swimming pool 500 including the safety system 100, according to an embodiment of the present invention. FIG. 6 illustrates a side view of the portion of the swimming pool 500.

The pool 500 includes an inside 505, to be filled with water, and a coping portion 510 in the form of edging along edge of the pool 500. The pool 500, including the coping portion 510 is formed of concrete 515. For clarity, the concrete 515 is transparent in FIGS. 5 and 6.

Reinforcement bars 520 in the form of interconnected mesh extend along the coping 510, and along an inside of the pool (not illustrated) to reinforce the concrete 515. The reinforcement bars 520 are laid out prior to concreting, and the safety system is then installed thereon.

In particular, clamps 525 are used to fasten the bar 110 of the safety system 100 to the reinforcement bars 520 at several points. Such configuration provides redundancy should any clamp 525 fail. The earth wire 120 is coupled to the central earth, and any additional conductive elements are coupled to the terminal block 115. The additional conductive elements may include metal fixtures, windows, electrical components and the like.

The concrete 515 is then poured so that an upper surface of the housing 105 is flush with the concrete 515. As such, the system 100 does not form a tripping hazard in the pool area, and is not large or unsightly, but when the lid 130 is removed, the housing 105 enables inspection of the bar 110, below a surface of the concrete 515, and at an area adjacent to the reinforcement bars 520, which are otherwise concealed.

While FIGS. 5 and 6 appear to illustrate separate reinforcement mesh on either side of the safety system 100, the skilled addressee will readily appreciate that the reinforcement mesh is coupled in other areas, to form a single conductive structure.

After the system 100 is installed, testing of the earthing is greatly simplified. In particular, the user may take the lid 130 off the system 100, and measure a resistance between the bar 110 and the earth, which may be at the main switchboard associated with the building. In normal circumstances, the resistance should be low, e.g. below 0.5Ω. Resistance is then measured between each additional conductive element and the bar 110 (e.g. the fence and the bar 110).

The resistance being low ensures that there is no (or minimal) voltage differential between conductive elements, should a fault occur. If, on the other hand, the earth is damaged, the resistance is high (or infinite), a substantial voltage drop may occur between conductive element, which can be dangerous in case of electrical fault, and must be further investigated.

According to certain embodiments, a label is provided under the lid 130, to assist an electrician conducting an inspection in identifying each of the earth wires. This is particularly useful when several additional conductive elements are coupled to the terminal block 115, as it enables the electrician to efficiently identify (and thus test) each component and wire individually.

The apertures may be filled or sealed, to prevent the ingress of concrete, water or other material. In certain cases, once the bar and earth wires are installed, the housing may be filled with epoxy, silicone, or other suitable material that may set in the housing, to protect the bar, terminal and wiring in the housing.

Figure 7:
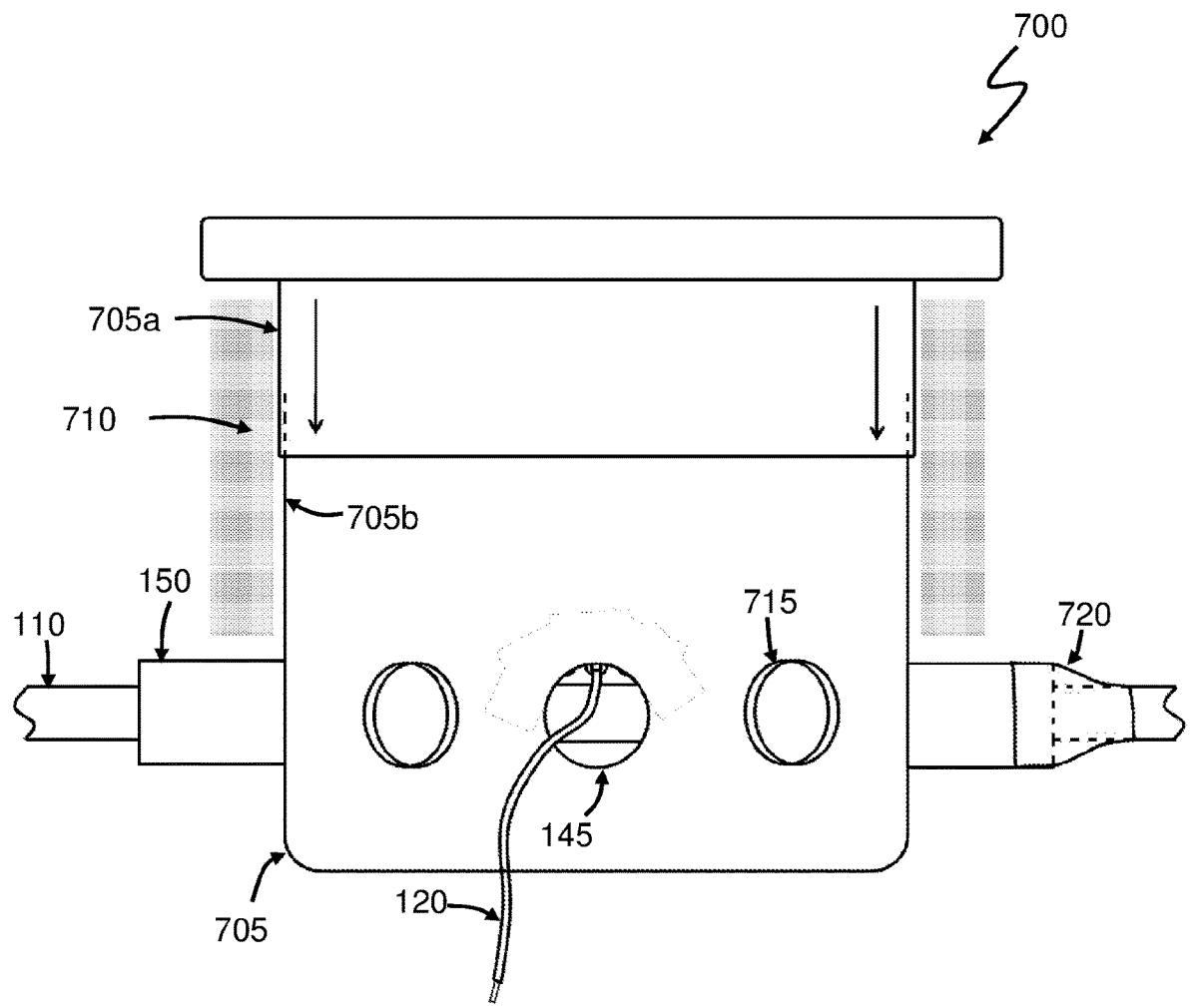
FIG. 7 is an axonometric view of a housing according to a preferred embodiment of the present invention.

FIG. 7 illustrates a side view of an electrical safety system 700, according to an embodiment of the present invention. The electrical safety system 700 is similar to the system 100 and enables easy inspection of earthing associated with underground reinforcement.

The electrical safety system 700 includes a housing 705, similar to the housing 105, but adjustable in height. In particular, the housing 705 includes an upper portion 705a and a lower portion 705b, which slide relative to each other to raise or lower a top of the housing 705. This is particularly advantageous when a pool is built, but it is not clear what type of tiles or outer surface will be used in the pool, as it allows the housing to be adjusted to suit the finished surface.

Furthermore, the lower portion 705b may be cut (in height) to reduce the overall height of the housing, if needed.

When the concrete is poured around the housing, it is desirable to shield the housing directly from the concrete using a foam expansion joint 710. The foam expansion joint 710 prevents the concrete from setting against the upper and lower portions 705a, 705b of the housing, and thus preventing the upper portion 705a from sliding relative to the lower portion 705b.

Furthermore, the housing 705 includes a plurality of knock-out portions 715, which can be knocked (or drilled) out to form the apertures 145. As such, the user is able to select a location and number of apertures used, which is desirable in that the system 700 may be used in many different configurations.

The apertures 145 may be sealed with heat shrink 720, to prevent debris or concrete from entering the housing through the aperture. In such case, the heat shrink is installed over the encircling sidewalls 150 and the bar 110, and heated until it shrinks and forms a seal between the bar 110 and the sidewall 150, thus sealing the aperture.

In other embodiments, rubber sleeves may be used to provide a seal between the encircling sidewalls 150 and the bar 110. In particular, the rubber sleeve may be stretched over the sidewall 150 and bar 110.

The skilled addressee will readily appreciate that any combination of pre-formed apertures and knock-outs may be provided. For example, a default configuration may be provided with apertures, and additional configurations may be provided as knock-outs. Alternatively, many apertures may be provided, together with plugs to fill unused apertures.

The housings 105, 705 may be formed of plastic, such as PVC plastic. The lid 130 may be formed of plastic, or stainless steel, for example. Advantageously, a stainless steel lid 130 is corrosion resistant, easy to clean, and aesthetically pleasing. Furthermore, the stainless steel lid is easily stamped to include branding, such as a logo, and/or contact details of the supplier.

The electrical safety system 800 illustrated in FIG. 8 is similar in most respects to that illustrated in FIG. 7 except for the location and operation of the upper portion 805a. The embodiment illustrated in FIG. 8 includes a two-part housing 805 including an upper portion 805a and a lower portion 805b, which slide relative to each other to raise or lower a top of the housing 805 and a lid 820. This is particularly advantageous when a pool is built, but it is not clear what type of tiles or outer surface will be used in the pool, as it allows the housing to be adjusted to suit the finished surface.

Furthermore, the lower portion 805b may be cut (in height) to reduce the overall height of the housing, if needed.

Furthermore, the lower portion 805b includes a plurality of knock-out portions 815, which can be knocked (or drilled) out to form the apertures 145. A tube 806 may be inserted into any one or more of the apertures formed by removal of the knock out portions 815. As such, the user is able to select a location and number of apertures used, which is desirable in that the system 800 may be used in many different configurations.

The lower portion 805b also include a pair of opposed rectangular openings 807 for the conductor bar (not shown for clarity).

The upper portion 805a includes an annular collar portion 808 and an upper, radially extending flange arrangement 809. A number of angled wedges 810 are located spaced about an upper portion of the collar portion 808 in order to control the separation of the collar 808 relative to the radially extending flange arrangement 809. The application of force will drive the collar 808 downwardly into the radially extending flange arrangement 809 to change the height of the housing 800.

The radially extending flange arrangement 809 includes an inner gutter 811 to receive a circumferential depending flange 813 of the lid thereinto. A bayonet mechanism 822 is also provided on the radially extending flange arrangement 809 and the underside of the lid. Gripping assemblies 821 are provided on an upper side of the lid 820 to allow a user to twist the lid relative to the collar 808 to open and secure the lid 820 relative to the collar 808.

While the system has been described with reference to pools, the skilled addressee will readily appreciate that the system may be installed in bathrooms, public toilets, or any other suitable wet area. In such case, the housing may be adjusted in size (e.g. smaller or larger), and multiple systems may be installed into large areas, or when reinforcement is provided in separate areas.

Furthermore, the system may be installed in an area adjacent to the wet area. In particular, in a concrete slab house, the wet areas may share reinforcing with the rest of the slab. As such, the system may be installed in a garage, or other part of the slab, while providing protection to the wet area.

Yet further again, the system may be installed in basements and other areas which are typically dry, which is advantageous should such area become wet, due to flooding, leakage, or other causes.

Advantageous, the system enables an inspector to quickly, inexpensively and non-invasively verify that components in a wet area are correctly earthed, including verifying compliance with a standard, such as AS/NZS3000:2007.

In the present specification and claims (if any), the word 'comprising' and its derivatives including 'comprises' and 'comprise' include each of the stated integers but does not exclude the inclusion of one or more further integers.

Reference throughout this specification to 'one embodiment' or 'an embodiment' means that a particular feature, structure, or characteristic described in connection with the embodiment is included in at least one embodiment of the present invention. Thus, the appearance of the phrases 'in one embodiment' or 'in an embodiment' in various places throughout this specification are not necessarily all referring to the same embodiment. Furthermore, the particular features, structures, or characteristics may be combined in any suitable manner in one or more combinations.

In compliance with the statute, the invention has been described in language more or less specific to structural or methodical features. It is to be understood that the invention is not limited to specific features shown or described since the means herein described comprises preferred forms of putting the invention into effect. The invention is, therefore, claimed in any of its forms or modifications within the proper scope of the appended claims (if any) appropriately interpreted by those skilled in the art.

The invention claimed is:

1. An electrical safety system, the electrical safety system comprising:
    a resealable housing including a lower containing portion and an upper annular collar which fits internally into the lower containing portion and slides relative thereto to adjust an effective height of the housing, the housing cast into a concrete structure of or associated with a wet area;
    a removable lid, providing resealable access to an inside of the resealable housing;
    a conductive element extending through the housing and coupled to metal reinforcing in the concrete structure that is adjacent to and outside of the housing to form a conductive coupling between the conductive element and the metal reinforcing; and
    an electrical coupling, housed in the housing, coupling an earth wire to earth the conductive element and thus the metal reinforcing.

2. An electrical safety system as claimed in claim 1, wherein the metal reinforcing, the housing and the conductive element are cast in the concrete structure such that the metal reinforcing and conductive element are concealed by the concrete structure.

3. An electrical safety system as claimed in claim 2, wherein the outer surface of the resealable housing is flush with a surface of the concrete structure.

4. An electrical safety system as claimed in claim 3, wherein the housing includes a substantially planar base with at least one substantially perpendicular sidewalls, through which the conductive element extends, the conductive element oriented substantially horizontally in use.

5. An electrical safety system as claimed in claim 1 wherein a seal is provided between the housing and the lid.

6. An electrical safety system as claimed in claim 4 wherein the housing includes a pair of opposed apertures, in the at least one sidewall, through which the conductive element extends.

7. An electrical safety system as claimed in claim 1, wherein the housing includes an aperture, through which the earth wire extends.

8. An electrical safety system as claimed in claim 1, wherein the housing includes a plurality of apertures, through which a plurality of earth wires respectively extend.

9. An electrical safety system as claimed in claim 4, wherein the base and sidewalls are formed of a single piece of plastic.

10. An electrical safety system as claimed in claim 1, wherein the electrical coupling includes a plurality of coupling elements, for coupling a plurality of additional conductive items to the conductive element, and thus to earth the additional conductive items to a common earth.

11. An electrical safety system as claimed in claim 1, wherein the conductive element is coupled to the metal reinforcing at two or more points.

12. An electrical safety system as claimed in claim 1, wherein the conductive element extends through opposing sides of the housing, for installation against the metal reinforcing on both sides of the housing.

13. An electrical safety system as claimed in claim 1, wherein the conductive element comprises a conductive bar.

14. An electrical safety system as claimed in claim 1, wherein the housing includes a number of indents to identify drill points or knock out portions to allow the addition of additional earth wires.

15. An electrical safety system as claimed in claim 1, wherein the lid is attachable to or relative to the upper annular collar, with a bayonet fitting.

16. An electrical safety system as claimed in claim 15, wherein the lid has at least one gripping recess to allow locking and unlocking of the lid relative to the upper annular collar.

17. An electrical safety system comprising:
    a resealable housing including a lower containing portion and an upper annular collar which fits internally into the lower containing portion and slides relative thereto to adjust an effective height of the housing, the housing cast into a concrete floor or wall;
    a conductive bar element extending through the housing, installed against metal reinforcing adjacent to the housing and cast into the concrete floor or wall; and
    an electrical coupling, coupled to the bar and housed in the housing coupled to an earth wire to earth the conductive bar element.

18. A swimming pool or spa electrical safety system comprising:
    a resealable housing including a lower containing portion and an upper annular collar which fits internally into the lower containing portion and slides relative thereto to adjust an effective height of the housing, the housing cast into a concrete structure of or associated with a swimming pool;
    a removable lid, providing resealable access to an inside of the resealable housing;
    a conductive element extending through the housing, and coupled to metal reinforcing in the concrete structure that is adjacent to and outside of the housing to form a conductive coupling between the conductive element and the metal reinforcing; and
    an electrical coupling, in the housing, coupling an earth wire to earth the conductive element and thus the metal reinforcing.

19. An electrical safety system as claimed in claim 1, wherein the housing includes a substantially planar base with at least one substantially perpendicular sidewalls, through which the conductive element extends, the conductive element oriented substantially horizontally in use.

* * * * *